(12) United States Patent
Yoshioka et al.

(10) Patent No.: US 8,975,897 B2
(45) Date of Patent: Mar. 10, 2015

(54) STATE-OF-CHARGE ESTIMATING APPARATUS

(75) Inventors: Shoji Yoshioka, Tokyo (JP); Akiko Tabuchi, Tokyo (JP); Keita Hatanaka, Tokyo (JP); Hidetoshi Kitanaka, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 347 days.

(21) Appl. No.: 13/640,056

(22) PCT Filed: Jun. 7, 2010

(86) PCT No.: PCT/JP2010/059626
§ 371 (c)(1),
(2), (4) Date: Oct. 9, 2012

(87) PCT Pub. No.: WO2011/155017
PCT Pub. Date: Dec. 15, 2011

(65) Prior Publication Data
US 2013/0027047 A1    Jan. 31, 2013

(51) Int. Cl.
*G01N 27/416* (2006.01)
*H02J 7/00* (2006.01)
*G01R 31/36* (2006.01)

(52) U.S. Cl.
CPC ........ *G01R 31/3662* (2013.01); *G01R 31/3651* (2013.01); *G01R 31/3658* (2013.01)
USPC .............. 324/427; 324/426; 320/132; 702/63

(58) Field of Classification Search
USPC ................ 324/427, 426; 320/132; 702/63
See application file for complete search history.

(56) References Cited

U.S. PATENT DOCUMENTS

| 5,672,951 A | 9/1997 | Shiota |
| 7,830,119 B2 * | 11/2010 | Naik ............................ 320/132 |

(Continued)

FOREIGN PATENT DOCUMENTS

| JP | 8-140270 A | 5/1996 |
| JP | 2002-238106 A | 8/2002 |

(Continued)

OTHER PUBLICATIONS

International Search Report (PCT/ISA/210) issued on Sep. 7, 2010, by the Japanese Patent Office as the International Searching Authority for International Application No. PCT/JP2010/059626.
Written Opinion (PCT/ISA/237) issued on Sep. 7, 2010, by the Japanese Patent Office as the International Searching Authority for International Application No. PCT/JP2010/059626.

*Primary Examiner* — M'Baye Diao
(74) *Attorney, Agent, or Firm* — Buchanan Ingersoll & Rooney PC

(57) ABSTRACT

A state-of-charge estimating apparatus includes at least a first arithmetic unit configured to calculate, as a first estimation value, the present estimation value calculated based on a battery capacity, the last estimation value, and an electric current flowing in and out between a current control apparatus, which controls charge and discharge amounts of a power storage apparatus, and the power storage apparatus, and a second arithmetic unit configured to calculate, during constant current control, as the present value of a second estimation value, an estimation value calculated based on an equivalent circuit model of a battery and a voltage of the battery and, on the other hand, calculate, during constant voltage control, as the second estimation value, the present estimation value calculated taking into account a resistance change of the battery based on the equivalent circuit model of the battery and the voltage of the battery.

8 Claims, 9 Drawing Sheets

(56) References Cited

U.S. PATENT DOCUMENTS

| | | |
|---|---|---|
| 7,957,921 B2 * | 6/2011 | Tang et al. .................... 702/63 |
| 8,108,161 B2 * | 1/2012 | Tomura et al. ................ 702/63 |
| 2002/0113595 A1 | 8/2002 | Sakai et al. |
| 2008/0091363 A1 * | 4/2008 | Lim et al. ...................... 702/63 |

FOREIGN PATENT DOCUMENTS

| | | |
|---|---|---|
| JP | 2003-75518 A | 3/2003 |
| JP | 2008-199723 A | 8/2008 |
| JP | 2010-71703 A | 4/2010 |

* cited by examiner

PRODUCT OF RESISTANCE 15 AND
CAPACITANCE OF CAPACITOR 18

STATE-OF-CHARGE ESTIMATING APPARATUS

FIELD

The present invention relates to a state-of-charge estimating apparatus that estimates a state of charge (SOC) of a battery such as a lithium ion secondary battery that is repeatedly charged and discharged.

BACKGROUND

In an automobile or a railway vehicle system, it is necessary to accurately grasp a state of charge of a battery during vehicle operation in a power storage system that performs power supply to a driving motor during the vehicle operation and electric energy collection during deceleration or stop.

In the past, as a method of estimating a state of charge, a method of calculating a state of charge from an integrated value of charge and discharge current values and a method of estimating a state of charge from an open circuit voltage of a battery are known. In a related art in which both the methods are used, a method of estimating a state of charge from current integration when a battery is charged and discharged and estimating a state of charge by estimating an open circuit voltage during standby is adopted (e.g., Patent Literature 1 described below). A state of charge can be estimated from an open circuit voltage. However, a technology for predicting an open circuit voltage in a closed circuit that performs charge and discharge is necessary. Concerning the technology, there is a method of calculating internal resistance from measurement values of an energization current and a battery voltage during the closed circuit using an equivalent circuit model of a battery (e.g., Patent Literatures 1, 2, and 3 described below).

CITATION LIST

Patent Literature

Patent Literature 1: Japanese Patent Application Laid-open No. 2008-199723
Patent Literature 2: Japanese Patent Application Laid-open No. 8-140270
Patent Literature 3: Japanese Patent Application Laid-open No. 2003-075518

SUMMARY

Technical Problem

A travelable distance of a railway vehicle or the like mounted with a power storage system is estimated from a state of charge. Therefore, an accurate grasp of a battery state of charge in the power storage system enables efficient operation of an apparatus. When a state of charge of a power storage apparatus including a large number of batteries arranged in serial and parallel, it is desirable to measure or estimate voltages, electric currents, states of charge of all the batteries included in the power storage apparatus. In general, a state of charge of a battery is in a one-to-one relation with an open circuit voltage. Therefore, it is possible to estimate the state of charge from the open circuit voltage.

In Patent Literature 1, an equivalent circuit model obtained by simplifying a battery is used in estimating an open circuit voltage. To calculate the open circuit voltage using an arithmetic operation, control information concerning temperature, resistance, capacitance, and the like and information concerning parameters representing battery characteristics are used besides a voltage and an electric current. However, because the same battery parameters are used in constant voltage control and constant current control, there is a problem in that the method cannot be adapted to all control conditions.

Concerning Patent Literatures 2 and 3, similarly, a state of charge can be estimated from an open circuit voltage based on a measured electric current and a measured voltage using an equivalent circuit model. However, internal resistance that substantially affects accuracy of a state of charge to be estimated includes diffusion resistance and electrode reaction resistance that show a nonlinear characteristic with respect to an electric current and a voltage. Therefore, it is difficult to estimate a state of charge using the equivalent circuit model in the past described by linear resistance.

The present invention has been devised in view of the above and it is an object of the present invention to obtain a state-of-charge estimating apparatus that can accurately estimate a state of charge and a state of deterioration of a battery.

Solution to Problem

In order to solve the aforementioned problems, a state-of-charge estimating apparatus according to one aspect of the present invention, which is connected to a power storage apparatus, in which a plurality of batteries are connected, and configured to estimate a state of charge indicating a residual capacity of the power storage apparatus, is constructed in such a manner that it includes: a first arithmetic unit configured to calculate, as a first state-of-charge estimation value, a present value of a state-of-charge estimation value calculated based on a battery capacity, a last value of the state-of-charge estimation value, and an electric current flowing in and out between a current control apparatus, which controls charge and discharge amounts of the power storage apparatus, and the power storage apparatus; a second arithmetic unit configured to calculate, during constant current control for charging the power storage apparatus with a constant current, as a present value of a second state-of-charge estimation value, a state-of-charge estimation value calculated based on an equivalent circuit model of the battery and a voltage of the battery and, on the other hand, calculate, during constant voltage control for charging the power storage apparatus with a constant voltage, as the second state-of-charge estimation value, a present value of a state-of-charge estimation value calculated taking into account a resistance change of the battery based on the equivalent circuit model of the battery and the voltage of the battery; and a correction arithmetic unit configured to periodically correct the first state-of-charge estimation value with the second state-of-charge estimation value.

Advantageous Effects of Invention

According to the present invention, an open circuit voltage and a state of charge of a battery are estimated from an equivalent circuit model including nonlinear resistance during constant voltage control based on temperature, a current change, and a voltage change during energization. Therefore, there is an effect that it is possible to accurately estimate a state of charge and a state of deterioration of the battery.

BRIEF DESCRIPTION OF DRAWINGS

FIG. 7-1 is a diagram for explaining a relation between a second arithmetic unit 31 and a databank 202.

FIG. 7-2 is a diagram for explaining the operation of second estimation processing by the second arithmetic unit 31.

FIG. 8-1 is a diagram of the configuration of a deterioration-amount calculating unit 35.

FIG. 8-2 is a diagram for explaining the operations of a voltage simulation unit 231 and a resistance/capacity calculating unit 232.

DESCRIPTION OF EMBODIMENTS

An embodiment of a state-of-charge estimating apparatus according to the present invention is explained in detail below based on the drawings. The present invention is not limited by the embodiment.

Embodiment

Figure 1:
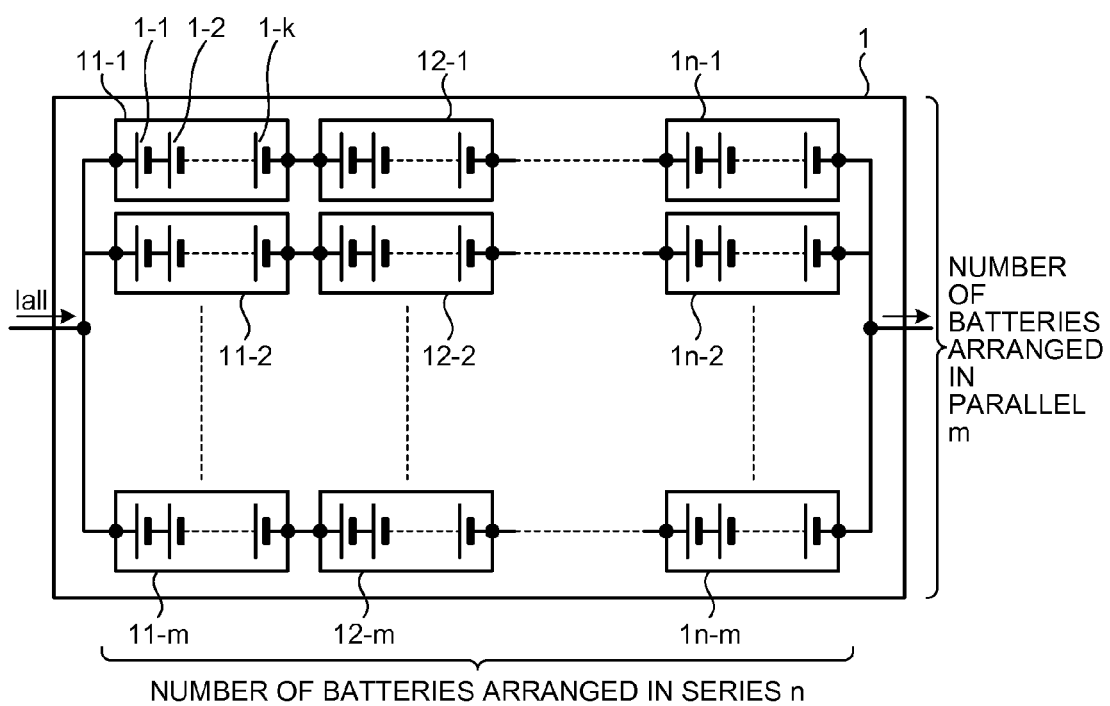
FIG. 1 is a configuration diagram of a power storage apparatus to which a state-of-charge estimating apparatus according to an embodiment of the present invention is applied.

FIG. 1 is a configuration diagram of a power storage apparatus 1 to which a state-of-charge estimating apparatus according to an embodiment of the present invention is applied.

The power storage apparatus 1 includes battery modules 11-1 to 1n-m, in each of which k single cells are connected in series. For example, the battery module 11-1 is a first battery module in a first row. Single cells 1-1 to 1-k are connected in series in the battery module 11-1. Similarly, the battery module 12-1 is a second battery module in the first row and the battery module 1n-1 is an n-th battery module in the first row. The battery module 11-2 is a first battery module in a second row, the battery module 12-2 is a second battery module in the second row, and the battery module 1n-2 is an n-th battery module in the second row. The battery module 11-m is a first battery module in an m-th row, the battery module 12-m is a second battery module in the m-th row, and the battery module 1n-m is an n-th battery module in the m-th row. Therefore, a total number of single cells is n×m×k.

The single cells 1-1 to 1-k are power storage devices that can be repeatedly charged and discharged such as a lithium ion secondary battery. States of charge of the single cells 1-1 to 1-k can be observed from an open circuit voltage value. A nickel-metal hydride battery, a lead storage battery, an electric double layer capacitor, a lithium ion capacitor, and the like can also be used as the power storage device configuring the power storage apparatus. Besides, a breaker, a battery monitoring device, and the like are sometimes provided in the power storage apparatus 1. However, these devices are not explained herein.

A voltage across terminals of the entire power storage apparatus is represented as total voltage Vall, a total current of charge and discharge currents is represented as Iall, and a charging direction is represented as positive. A voltage due to resistance components of a conductor and a cable used for connection of the terminals is added to Vall during charge and discharge.

To calculate a state of charge before charge and discharge when the power storage apparatus is not energized, a voltage at the time when an electric current is zero is represented as open circuit voltage. In a power storage device such as a lithium ion secondary battery, an open circuit voltage and an SOC are in a one-to-one relation under a fixed temperature environment. In general, the SOC shows a monotonic increase function concerning the open circuit voltage.

In the following explanation, a power storage system in which the power storage apparatus 1 is used is explained. Then, the configuration of the state-of-charge estimating apparatus according to this embodiment is explained.

Figure 2:
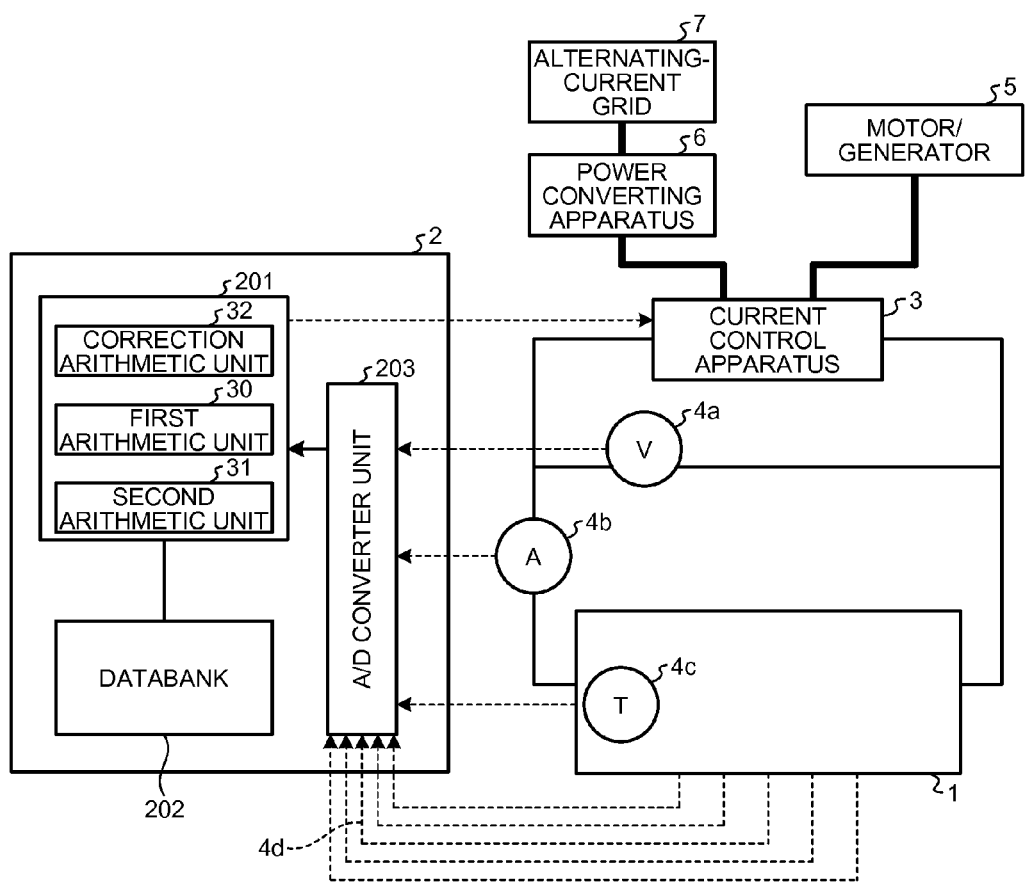
FIG. 2 is a configuration diagram of a power storage system to which the state-of-charge estimating apparatus according to the embodiment of the present invention is applied.

FIG. 2 is a configuration diagram of a power storage system to which the state-of-charge estimating apparatus according to the embodiment of the present invention is applied. The power storage apparatus 1 is controlled by a current control apparatus 3 based on a command from a controller 2. The controller 2 includes an A/D converter 203, a databank 202, and a parameter calculating unit 201. The controller 2 is the state-of-charge estimating apparatus according to this embodiment.

The A/D converter 203 converts analog signals transmitted from a total voltage sensor 4a, a total current detection sensor 4b, and a temperature sensor 4c in the power storage system and analog signals 4d transmitted from cell voltage sensors (not shown in the figure) in the power storage apparatus 1 into digital signals.

In the databank 202, battery data is stored and a formula describing a relation between an open circuit voltage and an SOC, a data table indicating the relation, or the like is stored. The relation between the open circuit voltage and the SOC is different depending on a type of a power storage device in use and electrode material types of a positive electrode and a negative electrode. Therefore, the relation is input in advance or calculated by measurement. As a method of calculating the relation, in an environment managed at fixed temperature, open circuit voltage data at the time when a known constant current is supplied for a fixed time to change the SOC at a fixed interval is acquired. The open circuit voltage is desirably measured after a state of zero current is maintained for about several hours. The open circuit voltage can be calculated as well from a state in which the power storage apparatus 1 is incorporated in a system. The calculation of the open circuit voltage can be executed at the start of a control program or execution of the program can be performed manually using a long-term nonuse period or a maintenance period.

As a method of calculating the relation between the open circuit voltage and the SOC, there are a method of calculating the relation from a complete discharge state and a method of calculating the relation from a full charge state. The method of calculating the relation from the complete discharge state is a method of setting a state of charge during complete discharge, in which a battery is discharged to a lower limit voltage of the battery, to zero, charging the battery at a fixed SOC interval, and calculating an open circuit voltage with respect to the SOC.

The method of calculating the relation from the full charge state is a method of, assuming that an SOC in a state in which a battery is charged by constant current and constant voltage charge to an upper limit of the battery is at 100%, discharging the battery at a fixed SOC interval, and changing the SOC. When both the methods are compared, a more stable state is obtained and accuracy of data is higher when the relation is calculated from the state of charge.

The current control apparatus 3 controls charge and discharge amounts of the power storage apparatus 1 according to a command from the parameter calculating unit 201 in the controller 2. When electric power is insufficient, the current control apparatus 3 outputs both of electric power supplied from an alternating-current grid 7 via a power converting apparatus 6 and electric power stored in the power storage apparatus 1 to a motor/generator 5. The current control apparatus 3 stores electric power generated by the motor/generator 5 in the power storage apparatus 1. The current control apparatus 3 causes, via the power converting apparatus 6, the alternating-current grid 7 to regenerate electric power exceeding the capacity of the power storage apparatus 1. The alternating-current gird 7 is, for example, an alternating-current power supply network that supplies electric power to a railway vehicle.

The parameter calculating unit 201 includes, as shown in FIG. 2, a first arithmetic unit 30, a second arithmetic unit 31, and a correction arithmetic unit 32. The first arithmetic unit 30 calculates a first state-of-charge estimation value (hereinafter simply referred to as "(first SOC)") based on a battery capacity (Ah) and an integrated value of supplied electricity amounts during battery charge and discharge. The second arithmetic unit 31 calculates a second state-of-charge estimation value (hereinafter simply referred to as "(second SOC)") using an open circuit voltage calculated from an equivalent circuit model including a resistance component and a capacitor component and a relation between the open circuit voltage and a state-of-charge estimation value. Specifically, the second arithmetic unit 31 executes second estimation processing for estimating a state-of-charge estimation value in a state of zero current, third estimation processing for estimating a state-of-charge estimation value from an open circuit voltage during constant current control in which a voltage changes, and fourth estimation processing for estimating a state-of-charge estimation value from an open circuit voltage during constant voltage control in which control is performed with a constant voltage. The correction arithmetic unit 32 periodically corrects an SOC estimated by the first arithmetic unit 30 with an SOC estimated by the second arithmetic unit 31.

Figure 3:
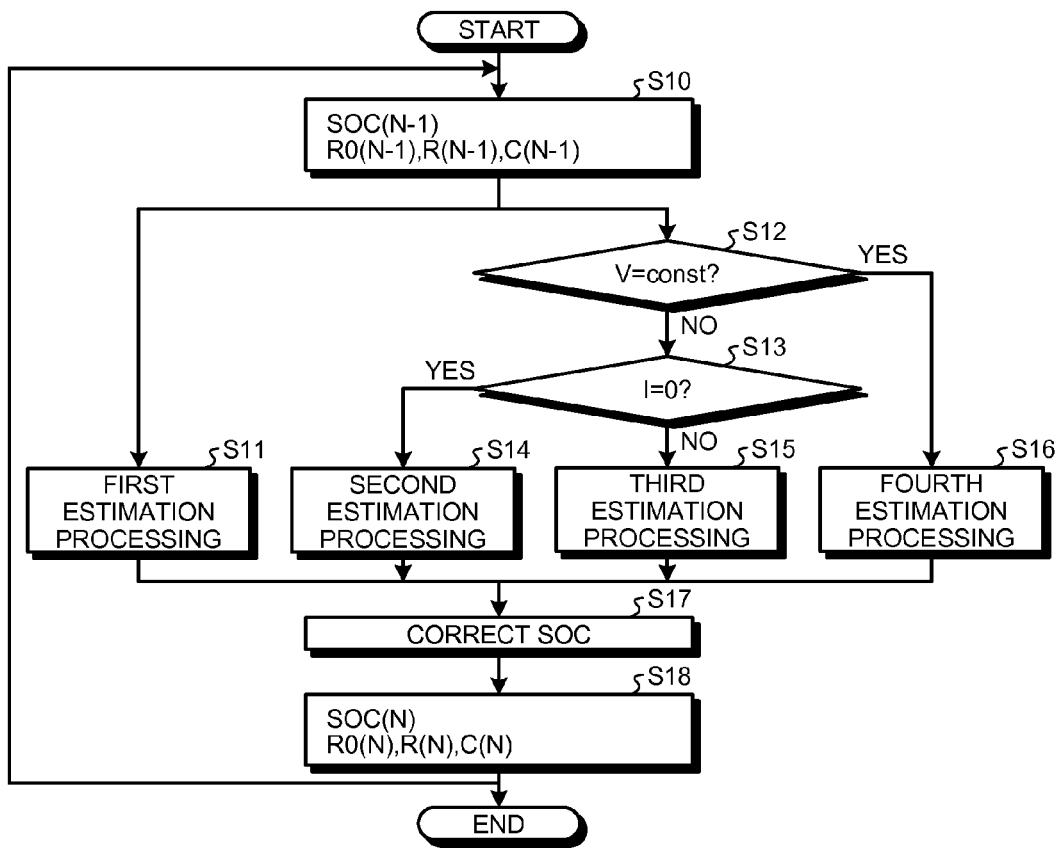
FIG. 3 is a flowchart for explaining SOC estimation processing by the state-of-charge estimating apparatus according to the embodiment of the present invention.

An SOC estimating operation executed by the parameter calculating unit 201 is generally explained with reference to FIG. 3. FIG. 3 is a flowchart for explaining SOC estimation processing by the state-of-charge estimating apparatus according to the embodiment of the present invention. The flowchart shown in FIG. 3 is repeated at a time interval same as an interval for acquiring data. The time interval means an acquisition interval for data such as an electric current, a voltage, and temperature. An interval of several milliseconds to several minutes is appropriate.

In the databank 202, for example, an SOC(N-1) obtained in the immediately preceding calculation flow, electron/ion resistance R0(N-1), electrode reaction resistance R(N-1), a capacitance component C(N-1), and the like are recorded (step S10).

First, the second arithmetic unit 31 switches the second to fourth estimation processing method according to whether control is constant current control or constant voltage control. For example, in an open circuit state of zero current (No at step S12 and Yes at step S13), the second arithmetic unit 31 executes the second estimation processing (step S14). During the constant current control in which a voltage changes (No at step S12 and No at step S13), the second arithmetic unit 31 executes the third estimation processing (step S15). Further, during the constant voltage control in which control is performed with a constant voltage (Yes at step S12), the second arithmetic unit 31 executes the fourth estimation processing (step S16). The correction arithmetic unit 32 corrects the first SOC with the second SOC.

In the databank 202, an SOC(N), electron/ion resistance R0(N), electrode reaction resistance R(N), and a capacitance component C(N) calculated by the first arithmetic unit 30 and the second arithmetic unit 31 are recorded (step S18).

The configurations and the operations of the first arithmetic unit 30 and the second arithmetic unit 31 are explained in detail with reference to FIGS. 4 to 11.

Figure 4:
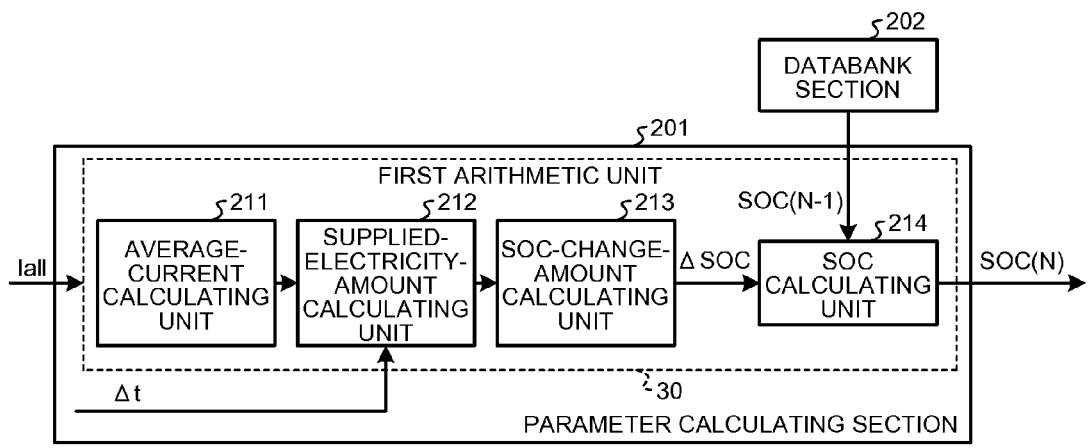
FIG. 4 is a configuration diagram of a first arithmetic unit according to the embodiment.

First, the configuration and the operation of the first arithmetic unit 30 are explained. FIG. 4 is a configuration diagram of the first arithmetic unit 30 according to this embodiment. The first arithmetic unit 30 includes, as main components, an average-current calculating unit 211, a supplied-electricity-amount calculating unit 212, an SOC-change-amount calculating unit 213, and an SOC calculating unit 214.

The total current Iall flowing through the power storage apparatus 1 is input to the average-current calculating unit 211. The average-current calculating unit 211 multiplies the total current Iall with a predetermined gain to calculate a current average. In other words, the average-current calculating unit 211 divides the total current Iall by the number m of the arrayed battery modules 11-1 to 1n-m to obtain an average of electric currents. The supplied-electricity-amount calculating unit 212 sets an arithmetic period to Δt, integrates supplied currents during charge and discharge, and calculates an electricity amount after electricity is supplied for a fixed time. The SOC-change-amount calculating unit 213 divides the electricity amount (coulomb) obtained by the supplied-electricity-amount calculating unit 212 by a battery capacity (Ah) and 3600 (s), and multiplies a quotient with 100 to calculate a change amount ΔSOC(%).

The SOC calculating unit 214 adds, during charge, the change amount ΔSOC to an SOC(N-1) obtained in the immediately preceding calculation flow and subtracts, during discharge, the change amount ΔSOC from the SOC(N-1) to obtain the present value SOC(N) of a state of charge. The SOC(N-1) is stored in the databank 202. The SOC calculating unit 214 estimates the SOC(N) using the SOC(N-1) stored in the databank 202. This is a simplest method of calculating an SOC. However, the method often includes an error of a current measurement value. Because of deterioration of a battery due to long-time use, a decrease in a 100% capacity value of the SOC also causes an error. Therefore, present value information of the battery capacity (Ah) is changed and input to the databank 202. The arithmetic period Δt can be generated in the parameter calculating unit 201 or can be generated outside of the parameter calculating unit 201.

Figure 5:
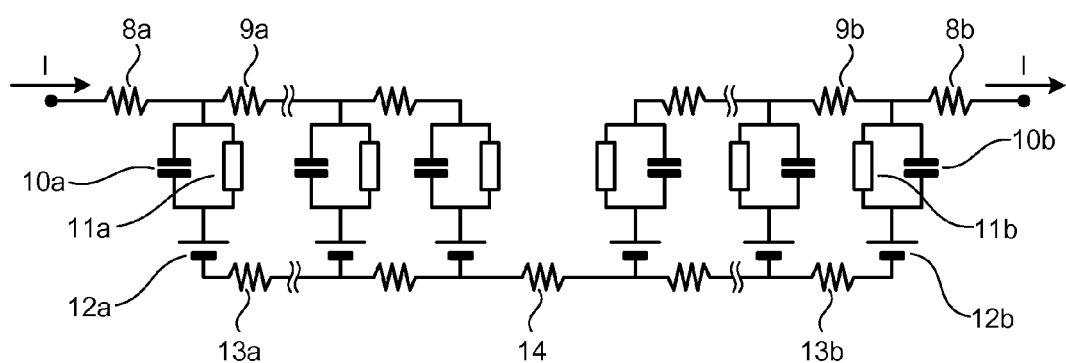
FIG. 5 is a diagram of a distributed constant system equivalent circuit model of a power accumulation device applicable to a second arithmetic operation according to the embodiment.

The second arithmetic unit 31 is explained. FIG. 5 is a diagram of a distributed constant system equivalent circuit model applicable to the second arithmetic unit 31 according to this embodiment. The second arithmetic unit 31 estimates an SOC, resistance, and the capacitance of a capacitor based on an equivalent circuit model. More strictly, the second arithmetic unit 31 calculates an open circuit voltage by fitting a measurement value of an electric current and a measurement value of a voltage to a numerical value model discretized based on a distributed constant system equivalent circuit shown in FIG. 5. A calculation formula includes resistance 8a of a negative electrode terminal, resistance 8b of a positive electrode terminal, electron resistance 9a of a negative electrode layer, electron resistance 9b of a positive electrode layer, capacitance 10a of a capacitor on a negative electrode interface, capacitance 10b of the capacitor on a positive electrode interface, a resistance component 11a on the negative electrode interface, a resistance component 11b on the positive electrode interface, a potential difference 12a that occurs on the negative electrode interface, a potential difference 12b that occurs on the positive electrode interface, resistance 13a of an electrolyte in the negative electrode, resistance 13b of an electrolyte in the positive electrode, and resistance 14 of an electrolytic solution in a separator of the distributed constant system equivalent circuit model shown in FIG. 5. The second arithmetic unit 31 calculates a plurality of resistances, capacitance values, and open circuit voltages by fitting time change measurement data of actually-measured electric currents and voltages and calculation values.

The capacitance 10a of the capacitor on the negative electrode interface and the capacitance 10b of the capacitor on the positive electrode interface are due to an electrode active material and an electric double layer formed on an electrolytic solution interface and are represented by a unit of farad. The capacitance 10a of the capacitor on the negative electrode interface and the capacitance 10b of the capacitor on the positive electrode interface are proportional to a surface area of the electrode active material and change according to characteristics of the electrolytic solution and also electrode potential.

The resistance component 11a on the negative electrode interface and the resistance component 11b on the positive electrode interface are resistances during a change of charge carriers from ions to electrons and from electrons to ions, and are resistances generated on the electrodes and the electrolytic solution interface. The resistance component 11a on the negative electrode interface and the resistance component 11b on the positive electrode interface include charge transfer resistance and diffusion resistance.

With such a distributed constant system equivalent circuit model, although strict calculation is possible, there is a demerit that a model size increases. Therefore, it is necessary to set a long calculation period and it is difficult to respond to quick changes in an electric current and a voltage. There is also a problem in that a large number of calculation resources are necessary. The distributed constant system equivalent circuit model shown in FIG. 5 indicates one single cell (e.g., 1-1) shown in FIG. 1. An electric current I flowing to the distributed constant system equivalent circuit model is a value obtained by dividing the total current Iall by the number of the arrayed battery modules 11-1 to 1n-m.

Figure 6:
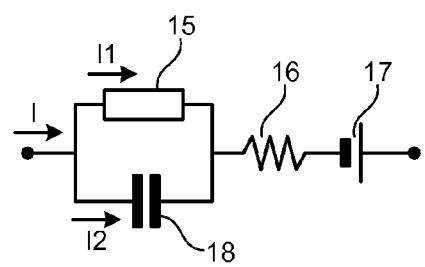
FIG. 6 is a diagram of a concentrated constant system equivalent circuit model of the power accumulation device applicable to the second arithmetic operation according to the embodiment.

On the other hand, a concentrated constant system equivalent circuit model in which a calculation period can be reduced and calculation resources can be saved is shown in FIG. 6. FIG. 6 is a diagram of a concentrated constant system equivalent circuit model of a power storage device applicable to the second arithmetic unit 31 according to this embodiment. The concentrated constant system equivalent circuit model is obtained by simplifying the distributed constant system equivalent circuit model shown in FIG. 5. The electric current I flowing to the concentrated constant system equivalent circuit model is a value obtained by dividing the total current Iall by the number of the arrayed battery modules 11-1 to 1n-m as explained above. Elements in this model are configured as explained below. The concentrated constant system equivalent circuit model shown in FIG. 6 includes resistance 15 concerning electrode reaction (hereinafter simply referred to as "resistance 15"), capacitance 18 of a capacitor generated on an electrode interface (hereinafter simply referred to as "capacitance 18"), resistance 16 concerning electrons and ions (hereinafter simply referred to as "resistance 16"), and an electromotive force section 17 equivalent to an open circuit voltage. The resistance 15 and the capacitance 18 are connected in parallel.

A value of the resistance 15 is represented as R, a capacitance value of the capacitance 18 is represented as C, and a value of the resistance 16 is represented as R0 (electron/ion resistance). When an electric current flowing through the resistance 15 is represented as I1 and an electric current flowing through the capacitance 18 is represented as I2, a sum of the electric currents I1 and I2 is the electric current I. A voltage applied to the capacitor (the capacitance 18) is equal to a voltage at both ends of the resistance 15 through which the electric current I1 flows. A temporal change in charges Q stored in the capacitor (the capacitance 18) is equivalent to the electric current I2. Therefore, a differential equation concerning the charges Q of Formula (1) is obtained.

$$\frac{dQ}{dt} + \frac{1}{CR}Q + I = 0 \tag{1}$$

When an arithmetic period is represented as Δt and Formula (1) is discretized concerning the charges Q, Formula (2) is obtained. Charges Q(N) at time N can be represented as indicated by Formula (2) by using charges Q(N-1) at the immediately preceding time (N-1) and the electric current I.

$$Q_{(N)} = Q_{(N-1)} \cdot \left(1 - \frac{\Delta t}{C(N-1) \cdot R(N-1)}\right) + \Delta t \cdot I \tag{2}$$

The electric current I2 flowing through the capacitor (the capacitance 18) can be represented by a temporal change in the charges Q shown in Formula (3).

$$I_2 = \frac{Q_{(N)} - Q_{(N-1)}}{\Delta t} \tag{3}$$

An open circuit voltage Voc is calculated from Formula (4) using Formulas (1) and (2) and a battery voltage V.

$$Voc = V + I \cdot R0(N) + I_1 \cdot R(N) \tag{4}$$

Figures 1, 7:
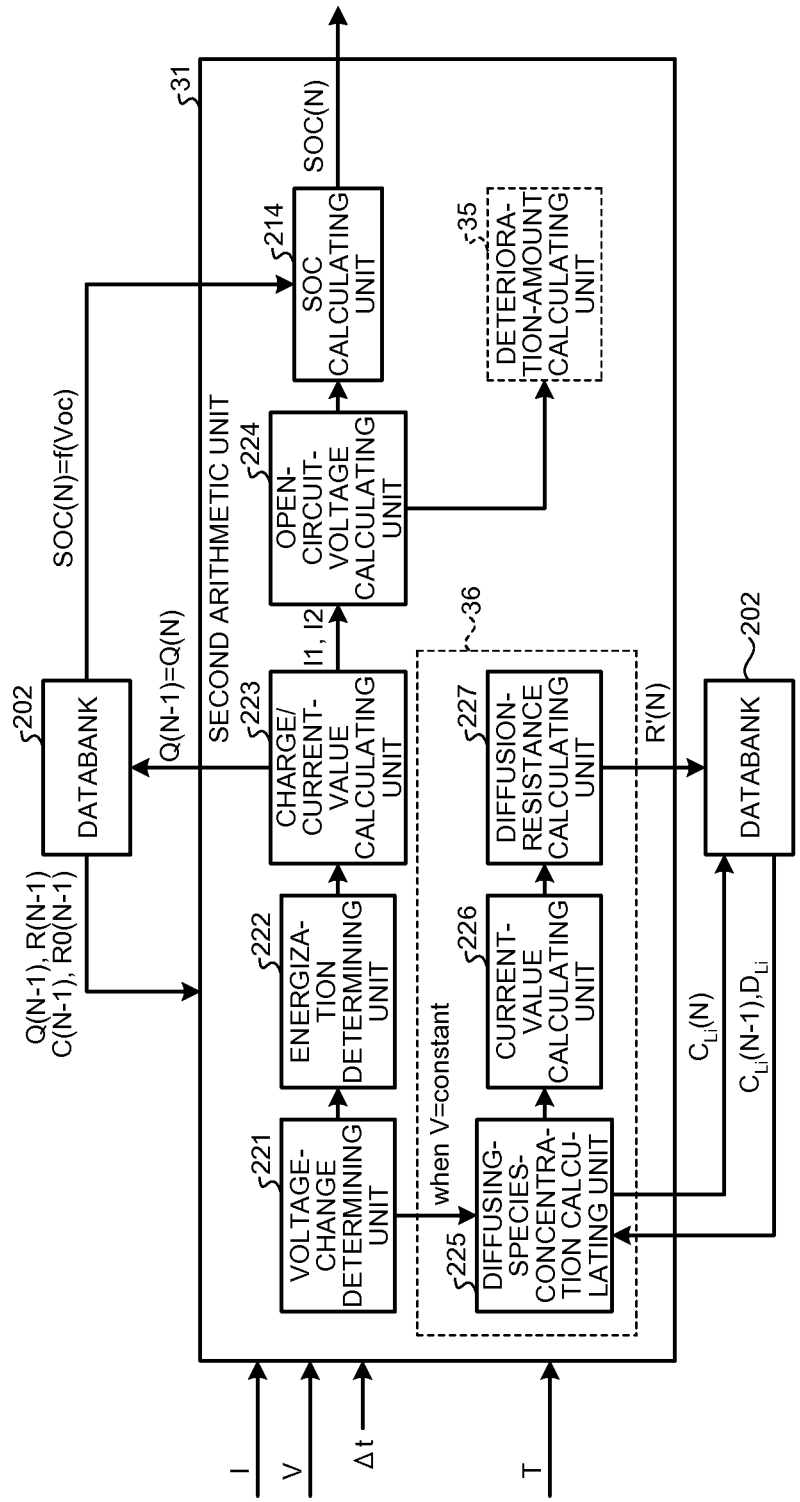
Figures 2, 7:
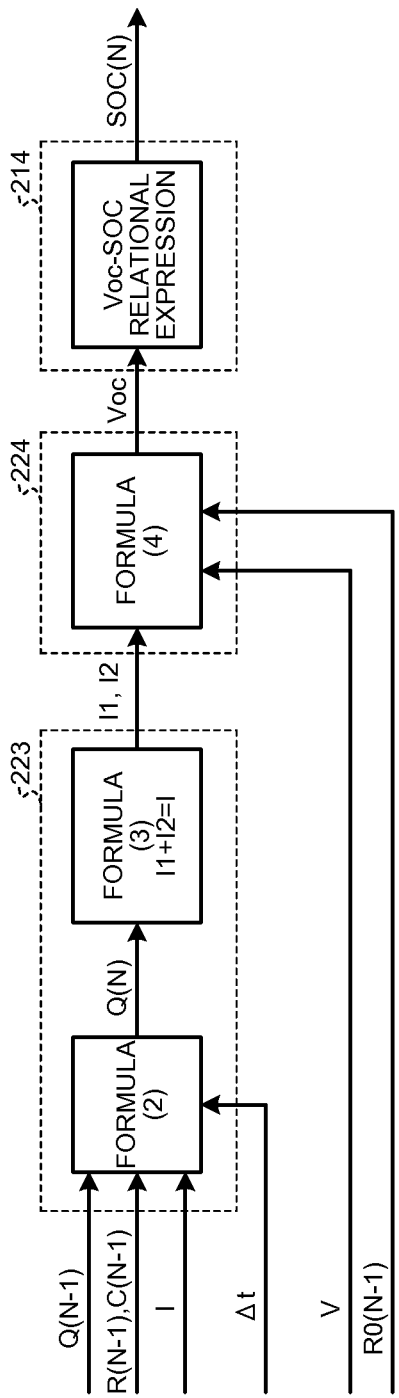

FIG. 7 is a diagram for explaining the configuration and the operation of the second arithmetic unit 31 according to this embodiment. FIG. 7-1 is a diagram for explaining a relation between the second arithmetic unit 31 and the databank 202. FIG. 7-2 is a diagram for explaining the operation of second estimation processing by the second arithmetic unit 31.

The second arithmetic unit 31 shown in FIG. 7-1 includes a voltage-change determining unit 221, an energization determining unit 222, a charge/current-value calculating unit 223, an open-circuit-voltage calculating unit 224, an SOC calculating unit 214, and a resistance calculating unit 36, wherein the open-circuit-voltage calculating unit 224 is further connected to a deterioration-amount calculating unit 35. The resistance calculating unit 36 includes a diffusing-species-concentration calculating unit 225, a current-value calculating unit 226, and a diffusion-resistance calculating unit 227.

The voltage-change determining unit 221 determines whether or not the battery voltage V changes in the arithmetic period Δt. In other words, the voltage-change determining unit 221 performs the determination at step S12 in FIG. 3.

If the battery voltage V changes (No at step S12), the energization determining unit 222 determines whether the electric current I is zero. In other words, the energization determining unit 222 performs the determination at step S13 in FIG. 3.

The charge/current-value calculating unit 223 calculates, using Formula (2), the charges Q(N) from the charges Q(N-1) stored in the capacitor 18 as an initial value of calculation, the electrode reaction resistance R(N-1), the capacitance value C(N-1), the electric current I, and the arithmetic period Δt, and calculates the electric current I2 using Formula (3). The charges Q(N-1), the electrode reaction resistance R(N-1), and the capacitance value C(N-1) are assumed to be stored in the databank 202. Further, the charge/current-value calculating unit 223 calculates the electric current I1 from a relation I=I1+I2.

The open-circuit-voltage calculating unit 224 calculates, using Formula (4), the open circuit voltage Voc from the battery voltage V and the value R0(N-1) of the resistance 16 stored in the databank 202. The value R0(N-1) of the resistance 16 is stored in the databank 202.

The SOC calculating unit 214 captures the open circuit voltage Voc from the open-circuit-voltage calculating unit 224 and estimates the SOC(N) using a relation between the open circuit voltage Voc and the SOC stored in the databank 202.

The second estimation processing and the third estimation processing by the second arithmetic unit 31 are explained below. From an energization state to zero current, a voltage substantially changes according to a polarization relaxation phenomenon and thereafter gradually approaches a constant voltage. The open-circuit-voltage calculating unit 224 sets the battery voltage V, the resistance 16, the resistance 16, and the electric current I to zero and calculates the open circuit voltage Voc from Formula (4) based on the battery voltage V and the value R0(N-1) of the resistance 16 stored in the databank 202. The SOC calculating unit 214 captures the open circuit voltage Voc from the open-circuit-voltage calculating unit 224 and estimates the second SOC using the relation between the open circuit voltage Voc and the SOC stored in the databank 202.

When a current value is fixed, the open-circuit-voltage calculating unit 224 calculates the open circuit voltage Voc from Formula (4) based on the battery voltage V, the resistance 15, the resistance 16, and the electric current I. The SOC calculating unit 214 estimates the second SOC using the relation between the open circuit voltage Voc and the SOC as explained above. Accuracy is higher in the second estimation processing for calculating the SOC without feeding an electric current.

Figures 1, 8:
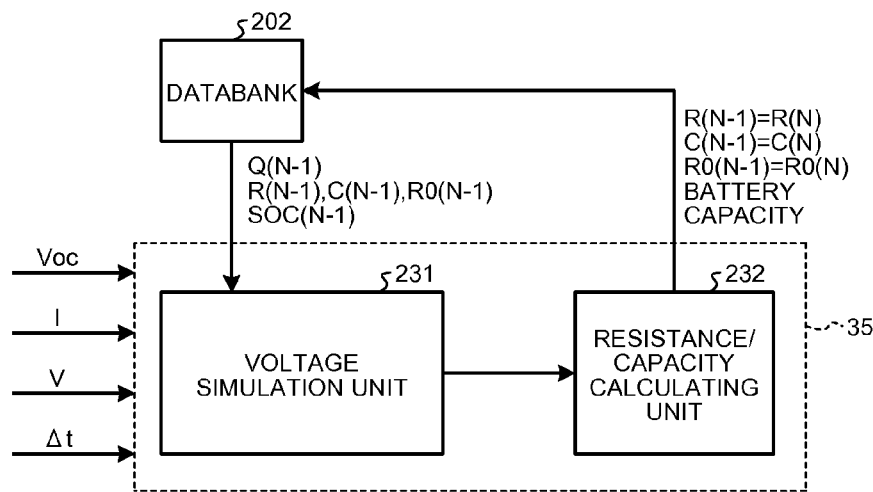
Figures 2, 8:
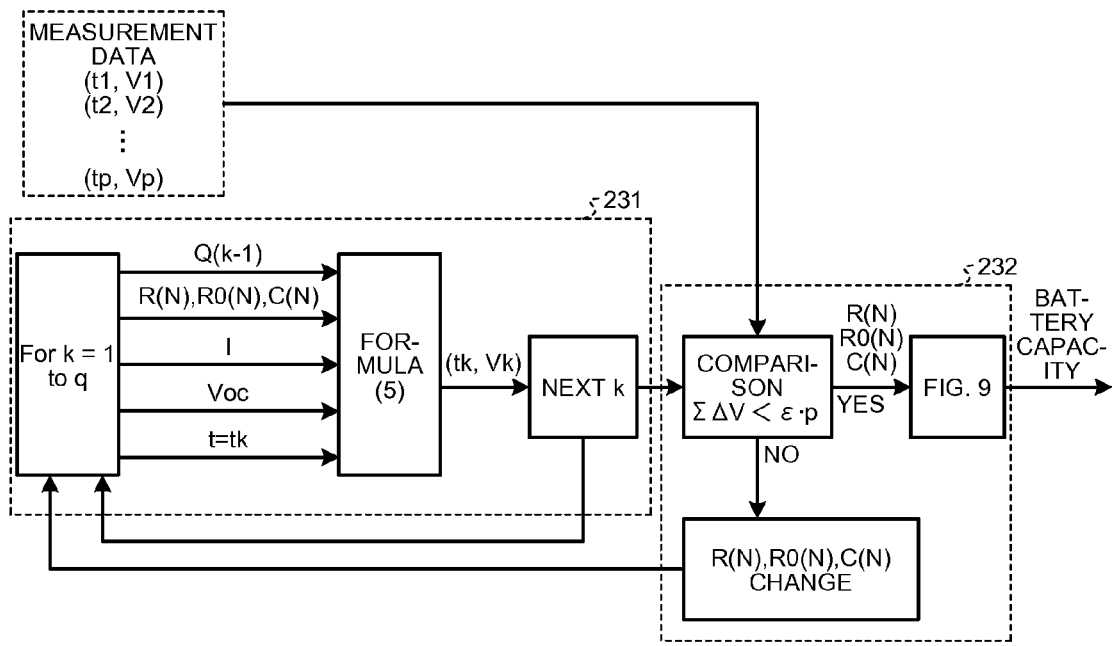
Figure 9:
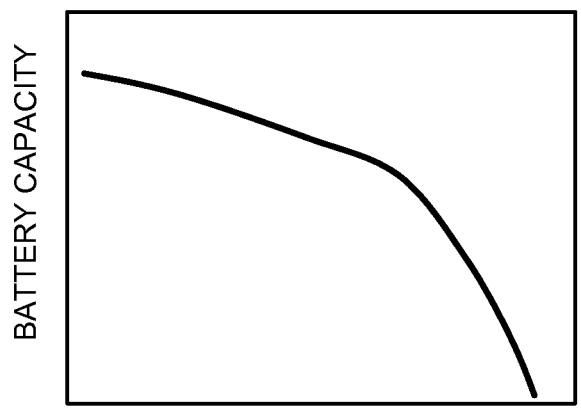
FIG. 9 is a diagram for explaining a relation between a product of resistance and the capacitance of a capacitor and a battery capacity.

The configuration and the operation of the deterioration-amount calculating unit 35 are explained with reference to FIGS. 8 and 9. FIG. 8 is a configuration diagram of the deterioration-amount calculating unit 35 according to this embodiment. FIG. 8-1 is a diagram of the configuration of the deterioration-amount calculating unit 35. FIG. 8-2 is a diagram for explaining the operations of a voltage simulation unit 231 and a resistance/capacity calculating unit 232. FIG. 9 is a diagram for explaining a relation between a product of resistance and the capacitance of a capacitor and a battery capacity.

The deterioration-amount calculating unit 35 shown in FIG. 8-1 includes, as main components, the voltage simulation unit 231 and the resistance/capacity calculating unit 232. The deterioration-amount calculating unit 35 estimates a deterioration state of a battery from current and voltage data in a fixed time according to changes in the resistance 15, the resistance 16, and the capacitance 18. Specifically, the deterioration-amount calculating unit 35 sequentially calculates a resistance component and a capacitance component of a capacitor in an assumed control mode to thereby estimate a degree of worsening of a battery deterioration state. For example, the deterioration-amount calculating unit 35 fits a plurality of voltage data and calculation values to each other to specify values of the resistance 15, the resistance 16, and the capacitance 18 respectively as the electrode reaction resistance R(N), the electron/ion resistance R0(N), and the capacitance component C(N).

The voltage data to be fitted are p data from time t1 to time tp. An individual data time interval is Δt. Calculation accuracy is further improved as the number of data to be referred to is larger. However, when a calculation load is taken into account, the number of data equal to or smaller than ten is desirable. An actual calculation procedure is explained below. The voltage simulation unit 231 sets charges stored in the capacitor 18 immediately before time t1 as Q(k-1), substitutes immediately preceding values respectively in the electrode reaction resistance R(N), the electron/ion resistance R0(N), and the capacitance component C(N), substitutes the values used in calculating the SOC shown in FIG. 7-1 in the electric current I and the open circuit voltage Voc, and calculates a voltage Vk with respect to time t1 using Formula (5). The charges Q(N) in Formula (5) are calculated using Formula (2).

$$V = Voc - I \cdot R0(N) - \frac{Q_{(N)}}{C(N)} \tag{5}$$

Similarly, the voltage simulation unit 231 performs the calculation in time t2 to time tp.

The resistance/capacity calculating unit 232 compares calculation values (voltage Vk) calculated by the voltage simulation unit 231 and measurement data (Vp). When a difference between a sum ΣΔV of differences between measurement values and the calculation values is smaller than a product of a determination value ε and the number of data p, the resistance/capacity calculating unit 232 regards the calculation values and the measurement data coincide with each other. On the other hand, when the difference between the sum ΣΔV of the differences between the measurement values and the calculation values is equal to or larger than the product of the determination value ε and the number of data p, the resistance/capacity calculating unit 232 changes the values of the electrode reaction resistance R(N), the electron/ion resistance R0(N), and the capacitance component C(N). For example, if a discharge voltage is lower than a calculation value, the resistance/capacity calculating unit 232 increases the voltage reaction resistance R(N), the electron/ion resistance R0(N), and the capacitance component C(N). Conversely, if the discharge voltage is higher than the calculation value, the resistance/capacity calculating unit 232 reduces the voltage reaction resistance R(N), the electron/ion resistance R0(N), and the capacitance component C(N).

It is convenient to use a product of the resistance 15 and the capacitance 18 as a fitting parameter. The resistance/capacity calculating unit 232 calculates a battery capacity using a relation between the product and the capacity of a deteriorated battery (see FIG. 9). However, the battery deterioration is not a reaction that suddenly worsens. Therefore, it is unnecessary to calculate deterioration at a data acquisition period. It is sufficient to calculate deterioration at a frequency of once immediately after startup or immediately before stop.

The fourth estimation processing is explained. The resistance 15 during the constant voltage control rises according to the elapse of time and does not take a fixed value. The value of the resistance 15 increases because, as indicated by Formula (6), which is the Nernst Einstein's formula, the resistance is proportional to an inverse of lithium ion concentration $C_{Li}(N)$ in the electrode active material. In the constant voltage control, the resistance is due to a decrease in the number of movable lithium ions.

$$R(N) = \frac{A \cdot T}{C_{Li} \cdot D_{Li}} \quad (6)$$

$D_{Li}$ represents a diffusion constant in an active material of lithium ion, T represents module temperature, and A represents a proportionality constant. As a temporal change of the lithium ion concentration $C_{Li}$ (N), a mass transfer formula including Formula (7), which is a diffusion equation, is numerically solved to calculate the resistance 15.

$$\frac{\partial C_{Li}}{\partial t} = D_{Li} \frac{\partial^2 C_{Li}}{\partial x^2} \quad (7)$$

Figure 10:
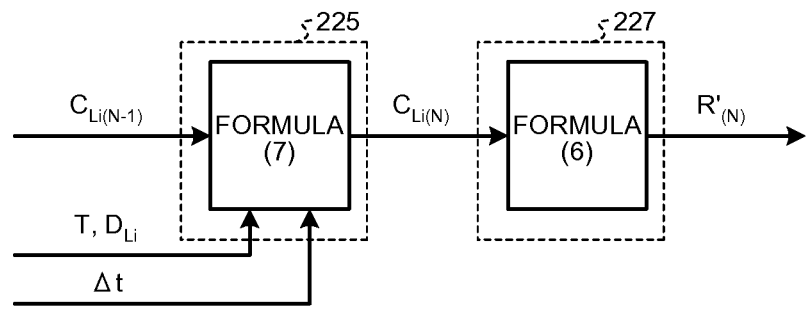
FIG. 10 is a diagram for explaining the operation of a resistance calculating unit according to the embodiment.
Figure 11:
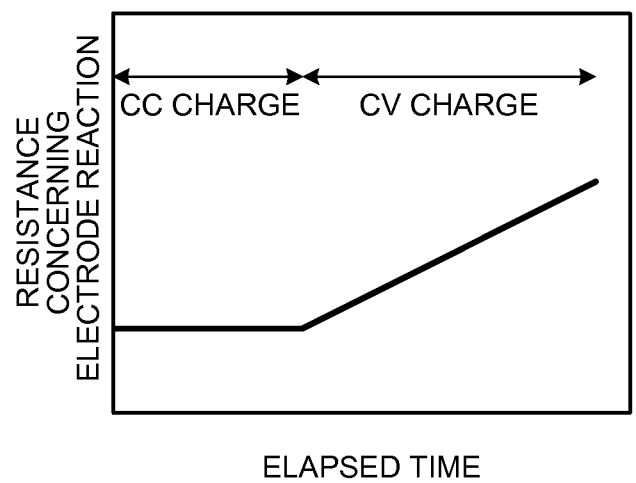
FIG. 11 is a diagram for explaining a change in resistance during constant voltage control.

The configuration and the operation of the resistance calculating unit 36 are explained below with reference to FIGS. 10 and 11. FIG. 10 is a diagram for explaining the operation of the resistance calculating unit 36 according to this embodiment. FIG. 11 is a diagram for explaining a change in resistance during the constant voltage control.

The diffusing-species-concentration calculating unit 225 solves Formula (7) under boundary conditions from movable lithium ion concentration $C_{Li}$ (N-1) and the diffusion coefficient $D_{Li}$ in the active material immediately before the constant voltage control is started and calculates the lithium ion concentration $C_{Li}$ (N) after an arithmetic period Δt time.

The current-value calculating unit 226 calculates a current value backward from a change in the battery voltage V. The diffusion-resistance calculating unit 227 estimates, based on the current value calculated by the current-value calculating unit 226 and a voltage during the constant current control, a value of the resistance 15 at the time when a voltage is not constant (CC charge: constant current charge). Further, the diffusion-resistance calculating unit 227 estimates, using Formula (6), a value of the resistance 15 at the time when a voltage is constant (CV charge: constant voltage charge).

A value of the resistance 15 concerning electrode reaction does not change during the CC charge but changes as shown in FIG. 11 during the CV charge. This resistance increase is a temporary increase that occurs in several seconds to several hours under constant voltage control conditions. When the second arithmetic unit 31 evaluates an increase in resistance due to deterioration of a battery on a real time basis, the second arithmetic unit 31 executes as well processing for excluding the resistance increase during constant voltage shown in FIG. 11 from the calculation for capacity deterioration estimation.

The speed of the increase in the resistance in a short period calculated above, i.e., a value obtained by dividing a resistance increase amount shown in FIG. 11 by a constant voltage control time indicates deterioration of a battery related to mass transfer. In this way, the second arithmetic unit 31 according to this embodiment predicts battery life due to long-term deterioration making use of the fact that the value increases according to worsening of the deterioration.

Figure 12:
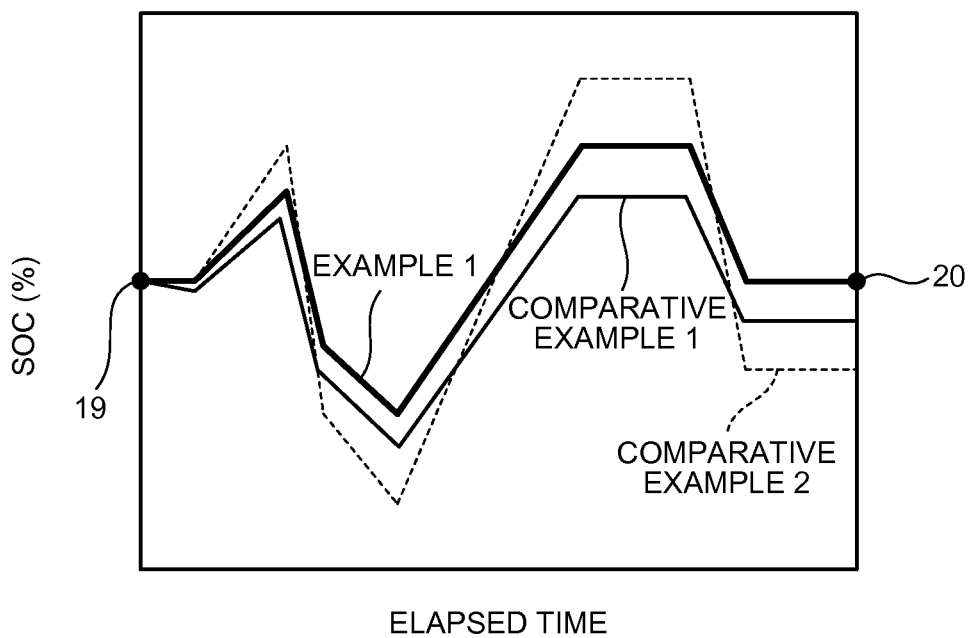
FIG. 12 is a diagram of SOC calculation accuracy in a deteriorated battery.

FIG. 12 is a diagram of SOC calculation accuracy in a deteriorated battery. A comparative example 1 is the transition of the first SOC calculated by the first arithmetic unit 30 according to the integration of supplied electricity amounts. Because, in general, an error is included in current values used for the calculation, an SOC deviates from a true value.

In a comparative example 2, the error is supplemented by the conventional SOC estimation processing by the equivalent circuit model. In a fresh initial battery, a satisfactory SOC estimation value is obtained. However, in SOC estimation of a lithium ion battery deteriorated because of a long-term use, a large error occurs.

An example 1 indicates the transition of an SOC estimated by the state-of-charge estimating apparatus according to this embodiment.

At a charge and discharge start point 19 and a charge and discharge end point 20, an SOC is a correct SOC calculated by leaving a battery untouched for three days or more in an open circuit. In the SOC estimating method according to the comparative example 1, a current value is detected and integrated smaller than an actual current value during charge and detected and integrated larger than an actual current value during discharge. As a result, an SOC is smaller than a true value over the entire charge and discharge. On the other hand, in the SOC estimating method according to the comparative example 2, an SOC is calculated without taking into account a capacity decrease due to deterioration. Therefore, because the SOC is calculated larger than a true value in both charge and discharge, the SOC excessively changes.

In the SOC estimating method according to the example 1, the deterioration-amount calculating unit 35 takes into account a capacity decrease due to battery deterioration. In addition, the resistance calculating unit 36 excludes a resistance increase during constant voltage from the calculation for capacity deterioration estimation. Therefore, it is possible to improve SOC calculation accuracy.

As explained above, the state-of-charge estimating apparatus according to this embodiment includes the first arithmetic unit 30, the second arithmetic unit 31, and the correction arithmetic unit 32. The first arithmetic unit 30 calculates, as the first state-of-charge estimation value, the present value of the state-of-charge estimation value calculated based on a battery capacity, the last value SOC(N-1) of the state-of-charge estimation value, and an electric current that flows in and flows out between the current control apparatus 3, which controls charge and discharge amounts of the power storage apparatus 1, and the power storage apparatus 1. The second arithmetic unit 31 calculates, during the constant current control, as the present value of the second state-of-charge estimation value, the state-of-charge estimation value calculated based on the equivalent circuit model of the battery and the voltage of the battery and, on the other hand, calculates, during the constant voltage control, as the second state-of-charge estimation value, the present value of the state-of-charge estimation value calculated taking into account a resistance change of the battery based on the equivalent circuit model of the battery and the voltage of the battery. The correction arithmetic unit 32 periodically corrects the first state-of-charge estimation value with the second state-of-charge estimation value. Therefore, it is possible to estimate the first SOC based on the battery capacity and the integrated value of the supplied electricity amounts during the battery charge and discharge, the second SOC in the state of zero current, the third SOC during the constant current control, and the fourth SOC during the constant voltage control. It is possible to accurately estimate a state of charge and a deterioration state of the battery compared with the related art.

The equivalent circuit model of the battery used in the second arithmetic unit 31 includes the concentrated constant system equivalent circuit model including one parallel circuit of a capacitor and a nonlinear resistor or the distributed constant system equivalent circuit model including a plurality of parallel circuits of capacitors and nonlinear resistors. Therefore, it is also possible to save calculation resources using the concentrated constant system equivalent circuit model or perform strict calculation using the distributed constant system equivalent circuit model.

The second arithmetic unit 31 according to this embodiment calculates the second state-of-charge estimation value based on the charges Q(N-1) stored in the capacitor, the capacitance value C(N-1) of the capacitor, the resistances (R(N-1)) and R0(N-1)) of the battery, and the voltage V of the battery. Therefore, it is possible to estimate the second state-of-charge estimation value with a simple configuration.

The second arithmetic unit 31 includes the deterioration-amount calculating unit 35. The deterioration-amount calculating unit 35 calculates the capacitance value C(N) and the resistances R(N) and R0(N) until the sum $\Sigma\Delta V$ of differences between a continuous plurality of voltage measurement values (Vp) measured after an electric current changes and the voltage calculation value (Vk) calculated based on the charges Q(N-1), the capacitance value C(N-1), and the resistances R(N-1) and R0(N-1) reaches the predetermined value (the product of the determination value $\epsilon$ and the number of data p). The deterioration-amount calculating unit 35 outputs, as an index for estimating a deterioration state of the battery, the capacitance C(N) and the resistances R(N) and R0(N) at the time when the sum $\Sigma\Delta V$ of the differences between the voltage measurement value (Vp) and the voltage calculation value (Vk) coincides with the predetermined value. Therefore, it is possible to accurately estimate a state of charge value by the equivalent circuit model compared with the related art.

The battery capacity is calculated based on the product of the capacitance C(N) and the resistances R(N) and R0(N). Therefore, the first arithmetic unit 30 can accurately calculate the first state-of-charge estimation value using the battery capacity calculated by the deterioration-amount calculating unit 35.

The second arithmetic unit 31 includes the resistance calculating unit 36 that calculates the resistance R(N) of the battery during the constant voltage control based on the movable lithium ion concentration $C_{Li}$ (N-1) and the diffusion coefficient $D_{Li}$ in an active material of lithium ion. Therefore, it is possible to exclude a resistance increase during constant voltage from the calculation for capacity deterioration estimation and improve the SOC calculation accuracy.

INDUSTRIAL APPLICABILITY

As explained above, the present invention is applicable to the state-of-charge estimating apparatus that estimates an SOC in a storage battery such as a secondary battery and is, in particular, useful as an invention that can improve SOC estimation accuracy.

REFERENCE SIGNS LIST 1 power storage apparatus
1-1, 1-2, 1-k single cells
3 controller
3 current control apparatus
4a total voltage sensor
4b total current detection sensor
4c temperature sensor
4d analog signal transmitted from a voltage sensor
5 motor/generator
6 power converting apparatus
7 alternating-current grid
8a resistance of a negative electrode terminal
8b resistance of a positive electrode terminal
9a electron resistance of a negative electrode layer
9b electron resistance of a positive electrode layer
10a capacitance of a capacitor on a negative electrode interface
10b capacitance of a capacitor on a positive electrode interface
11-1, 12-1, 1n-1, 11-2, 12-2, 1n-2, 11-m, 12-m, 1n-m battery modules
11a resistance component on the negative electrode interface
11b resistance component on the positive electrode interface
12a potential difference that occurs on the negative electrode interface
12b potential difference that occurs on the positive electrode interface
13a resistance of an electrolyte in the negative electrode
13b resistance of an electrolyte in the positive electrode
14 resistance of an electrolyte solution in a separator
15 resistance concerning electrode reaction
16 resistance concerning electrons/ions
17 electromotive force section equivalent to an open circuit voltage
18 capacitance of a capacitor generated on an electrode interface
19 charge and discharge start point
20 charge and discharge end point
30 first arithmetic unit
31 second arithmetic unit
32 correction arithmetic unit
35 deterioration-amount calculating unit
36 resistance calculating unit
201 parameter calculating unit
202 databank section
203 A/D converter
211 average-current calculating unit
212 supplied-electricity-amount calculating unit
213 SOC-change-amount calculating unit
214 SOC calculating unit
221 voltage-change determining unit
222 energization determining unit
223 charge/current-value calculating unit
224 open-circuit-voltage calculating unit
225 diffusing-species-concentration calculating unit
226 current-value calculating unit
227 diffusion-resistance calculating unit
231 voltage simulation unit
232 resistance/capacity calculating unit
Iall total current
T module temperature
Vall total voltage
Voc open circuit voltage
The invention claimed is:
1. A state-of-charge estimating apparatus connected to a power storage apparatus, in which a plurality of batteries are connected, and configured to estimate a state of charge indicating a residual capacity of the power storage apparatus, the state-of-charge estimating apparatus comprising:
- a first arithmetic unit configured to calculate, as a first state-of-charge estimation value, a present value of a state-of-charge estimation value calculated based on a battery capacity, a last value of the state-of-charge estimation value, and an electric current flowing in and out between a current control apparatus, which controls charge and discharge amounts of the power storage apparatus, and the power storage apparatus;
- a second arithmetic unit configured to calculate, during constant current control for charging the power storage apparatus with a constant current, as a present value of a second state-of-charge estimation value, a state-of-charge estimation value calculated based on an equivalent circuit model of the battery and a voltage of the battery and, on the other hand, calculate, during constant voltage control for charging the power storage apparatus with a constant voltage, as the second state-of-charge estimation value, a present value of a state-of-charge estimation value calculated taking into account a resistance change of the battery based on the equivalent circuit model of the battery and the voltage of the battery; and
- a correction arithmetic unit configured to periodically correct the first state-of-charge estimation value with the second state-of-charge estimation value.

2. The state-of-charge estimating apparatus according to claim 1, wherein the equivalent circuit model of the battery includes an equivalent circuit model including one parallel circuit of a capacitor and a nonlinear resistor or an equivalent circuit model including a plurality of parallel circuits of capacitors and nonlinear resistors.

3. The state-of-charge estimating apparatus according to claim 2, wherein the second arithmetic unit calculates the second state-of-charge estimation value based on charges stored in the capacitor, a capacitance value of the capacitor, resistance of the battery, and the voltage of the battery.

4. The state-of-charge estimating apparatus according to claim 1, wherein the second arithmetic unit includes a deterioration-amount calculating unit configured to calculate the capacitance value and the resistance until a sum of differences between a continuous plurality of voltage measurement values measured after an electric current changes and a voltage calculation value calculated based on the charges, the capacitance value, and the resistances reaches a predetermined value and output, as an index for estimating a deterioration state of the battery, capacitance of the capacitor and resistance of the battery at the time when the sum of the differences between the voltage measurement value and the voltage calculation value coincides with the predetermined value.

5. The state-of-charge estimating apparatus according to claim 4, wherein the deterioration-amount calculating unit calculates a battery capacity based on a product of the capacitance of the capacitor and the resistance of the battery.

6. The state-of-charge estimating apparatus according to claim 1, wherein the second arithmetic unit includes a resistance calculating unit that calculates resistance of the battery during the constant voltage control based on movable lithium ion concentration and a diffusion coefficient in an active material of lithium ion.

7. The state-of-charge estimating apparatus according to claim 4, wherein the second arithmetic unit calculates the second state-of-charge estimation value using the capacitance and the resistance calculated by the deterioration-amount calculating unit.

8. The state-of-charge estimating apparatus according to claim 6, wherein the second arithmetic unit calculates the second state-of-charge estimation value using the resistance of the battery calculated by the resistance calculating unit.

* * * * *